United States Patent
Wicker

(10) Patent No.: US 6,597,009 B2
(45) Date of Patent: Jul. 22, 2003

(54) REDUCED CONTACT AREA OF SIDEWALL CONDUCTOR

(75) Inventor: Guy C. Wicker, Santa Clara, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/039,832

(22) Filed: Jan. 4, 2002

(65) Prior Publication Data

US 2002/0058389 A1 May 16, 2002

Related U.S. Application Data

(62) Division of application No. 09/676,314, filed on Sep. 29, 2000, now Pat. No. 6,429,064.

(51) Int. Cl.$^7$ .................................................. H01L 47/00
(52) U.S. Cl. ................... 257/4; 257/3; 257/5; 365/100; 365/148
(58) Field of Search ..................... 257/3, 4, 5; 365/100, 365/148

(56) References Cited

U.S. PATENT DOCUMENTS

| | | |
|---|---|---|
| 5,296,716 A | 3/1994 | Ovshinsky et al. |
| 5,789,758 A * | 8/1998 | Reinberg ..................... 257/3 |
| 5,879,955 A | 3/1999 | Gonzalez et al. |
| 5,920,788 A | 7/1999 | Reinberg |
| 5,933,365 A | 8/1999 | Klersy et al. |
| 5,970,336 A | 10/1999 | Wolstenhome et al. |
| 5,998,244 A | 12/1999 | Wolstenholme et al. |
| 6,002,140 A | 12/1999 | Gonzalez et al. |
| 6,031,287 A | 2/2000 | Harshfield |
| 6,087,674 A | 7/2000 | Ovshinsky et al. |
| 6,153,890 A | 11/2000 | Wolstenholme et al. |
| 6,229,157 B1 | 5/2001 | Sandhu |
| 6,339,544 B1 * | 1/2002 | Chiang et al. ............... 365/163 |
| 6,369,431 B1 * | 4/2002 | Gonzalez et al. ........... 257/390 |
| 6,404,665 B1 * | 6/2002 | Lowrey et al. ............. 365/100 |

* cited by examiner

Primary Examiner—Trung Dang
(74) Attorney, Agent, or Firm—Blakely, Sokoloff, Taylor & Zafman LLP

(57) ABSTRACT

A method including, in a dielectric material over a contact on a substrate, forming a trench to the contact; introducing an electrode material along the sidewalls of the trench; introducing a phase change material over material along a first sidewall; and modifying the electrode material along the sidewalls such that only the material along the first sidewall acts as a conductive path between the contact and the phase change material. An apparatus including a chalcogenide memory element; a contact; and a heater element comprising two leg portions, a first leg portion coupled to the contact and the chalcogenide memory element, and only the first leg portion acts as a conductive path between the contact and the chalcogenide memory element.

6 Claims, 15 Drawing Sheets

US 6,597,009 B2

REDUCED CONTACT AREA OF SIDEWALL CONDUCTOR

This application claims the benefit of the earlier filing date of divisional application of Guy C. Wicker entitled, "Reduced Contact Area of Sidewall Conductor," Ser. No. 09/676,314, filed Sep. 29, 2000 now U.S. Pat. No. 6,429,064 and incorporated herein by reference.

BACKGROUND OF THE INVENTION

1. Field of the Invention

The invention relates generally to programmable memory devices.

2. Background

Typical memory applications include dynamic random access memory (DRAM), static random access memory (SRAM), erasable programmable read only memory (EPROM), and electrically erasable programmable read only memory (EEPROM).

Solid state memory devices typically employ microelectronic circuit elements for each memory bit (e.g., one to four transistors per bit) in memory applications. Since one or more electronic circuit elements are required for each memory bit, these devices may consume considerable chip "real estate" to store a bit of information, which limits the density of a memory chip. The primary "non-volatile" memory element of these devices, such as an EEPROM, typically employ a floating gate field effect transistor device that has limited re-programmability and which holds a charge on the gate of field effect transistor to store each memory bit. These classes of memory devices are also relatively slow to program.

Phase change memory devices use phase change materials, i.e., materials that can be electrically switched between a generally amorphous and a generally crystalline state, for electronic memory application. One type of memory element originally developed by Energy Conversion Devices, Inc. of Troy, Mich. utilizes a phase change material that can be, in one application, electrically switched between a structural state of generally amorphous and generally crystalline local order or between different detectable states of local order across the entire spectrum between completely amorphous and completely crystalline states. Typical materials suitable for such application include those utilizing various chalcogenide elements. These electrical memory devices typically do not use field effect transistor devices, but comprise, in the electrical context, a monolithic body of thin film chalcogenide material. As a result, very little chip real estate is required to store a bit of information, thereby providing for inherently high density memory chips. The state change materials are also truly non-volatile in that, when set in either a crystalline, semi-crystalline, amorphous, or semi-amorphous state representing a resistance value, that value is retained until reset as that value represents a physical state of the material (e.g., crystalline or amorphous). Thus, phase change memory materials represent a significant improvement in non-volatile memory.

The phase change memory devices developed by Energy Conversion Devices, Inc. generally include an electrode between a phase change material and a contact, with the phase change material being electrically isolated from the substrate on which it is formed. Such memory devices typically also include an isolation device in series with the phase change material to permit selective programming of the phase change material. Generally, the size of the memory device is directly related to the size of the electrical contact to the phase change material. It would be desirable to develop techniques to reduce the size of the electrode and the corresponding memory device so that, among other benefits, power requirements to program the memory device may be reduced.

One characteristic common to solid state and phase change memory devices is significant power consumption particularly in setting or resetting memory elements. Power consumption is significant, particularly in portable devices that rely on power cells (e.g., batteries). It would be desirable to decrease the power consumption of a memory device.

DETAILED DESCRIPTION OF THE INVENTION

The invention generally relates to a method used, in one aspect, to form a memory device or a plurality of memory devices. In one embodiment, the method includes, in a dielectric material over a contact on a substrate, forming a trench to the contact and introducing a phase change material over electrode material long a first sidewall. The method also includes modifying the electrode material along the sidewalls such that only the material along the first sidewall acts as a conductive path between the contact and the phase change material. By modifying the electrode material, the contact area between the electrode and the phase change material may be reduced, alignment tolerance concerns over the placement of the phase change material may be reduced, and the consistency of the contact area and thus device performance may be improved. In this manner, an improved memory device (e.g., memory element, memory array, etc.) with improved setting and resetting capabilities is presented.

The invention also relates to an apparatus including a chalcogenide element, a contact, and a heater element. In one embodiment, the heater element includes two leg portions with a first leg portion coupled to the contact and the chalcogenide memory element. Only the first leg portion acts as a conductive path between the contact and the chalcogenide memory element. Like the method discussed above, by limiting one leg portion of, for example, a trench lined with electrode material to be the conductive path, the contact area may be reduced and device performance improved.

In the following paragraphs and in association with the accompanying figures, an example of a memory device formed according to an embodiment of the invention is presented. The embodiment describes a memory material including a phase change material wherein the phase of the material determines the state of the memory element.

Figure 1:
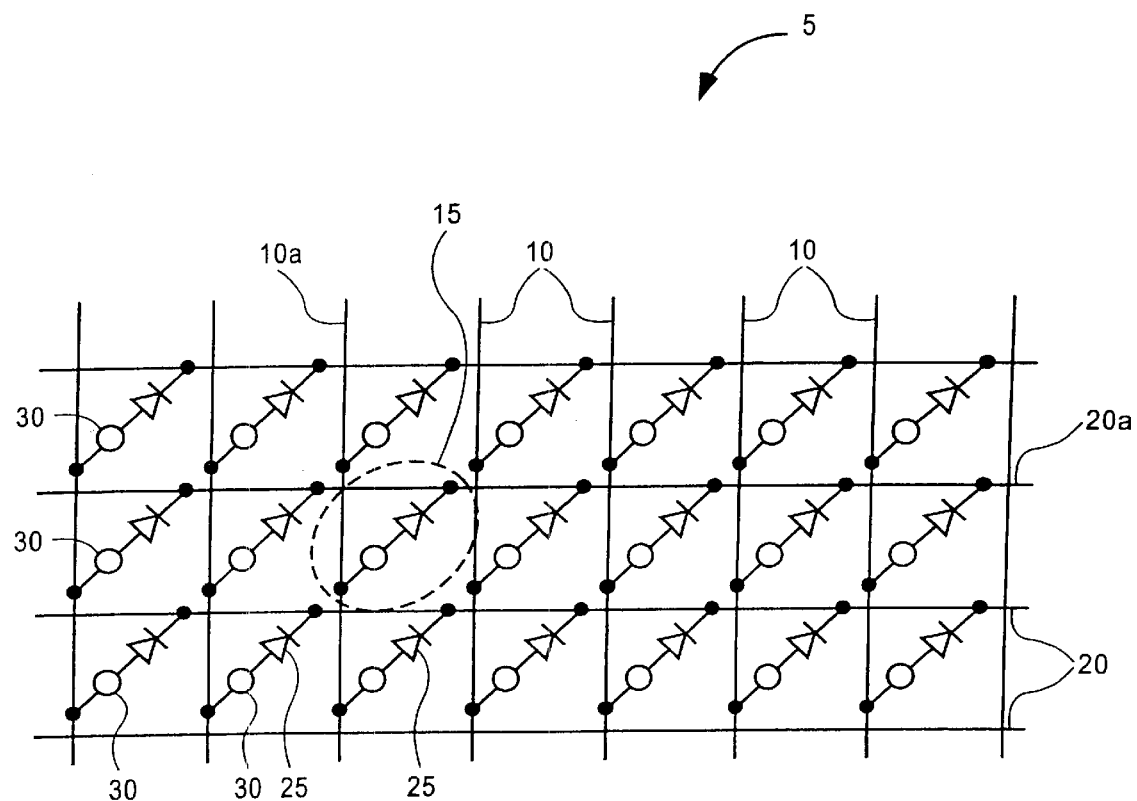
FIG. 1 is a schematic diagram of an array of memory elements according to an embodiment of the invention.

FIG. 1 shows a schematic diagram of an embodiment of a memory array comprised of a plurality of memory elements presented and formed in the context of the invention. In this example, the circuit of memory array 5 includes an xy grid with memory element 30 electrically interconnected in series with isolation device 25 on a portion of a chip. Address lines 10 (e.g., columns) and 20 (e.g., rows) are connected, in one embodiment, to external addressing circuitry in a manner known to those skilled in the art. One purpose of the xy grid array of memory elements in combination with isolation devices is to enable each discrete memory element to be read and written without interfering with the information stored in adjacent or remote memory elements of the array.

A memory array such as memory array 5 may be formed in a portion, including the entire portion, of a substrate. A typical substrate includes a semiconductor substrate such as a silicon substrate. Other substrates including, but not limited to, substrates that contain ceramic material, organic material, or glass material as part of the infrastructure are also suitable. In the case of a silicon semiconductor substrate, memory array 5 may be fabricated over an area of the substrate at the wafer level and then the wafer reduced through singulation into discrete die or chips, some or all of the die or chips having a memory array formed thereon. Additional addressing circuitry (e.g., decoders, etc.) may be formed in a similar fashion as known to those of skill in the art.

Figure 2:
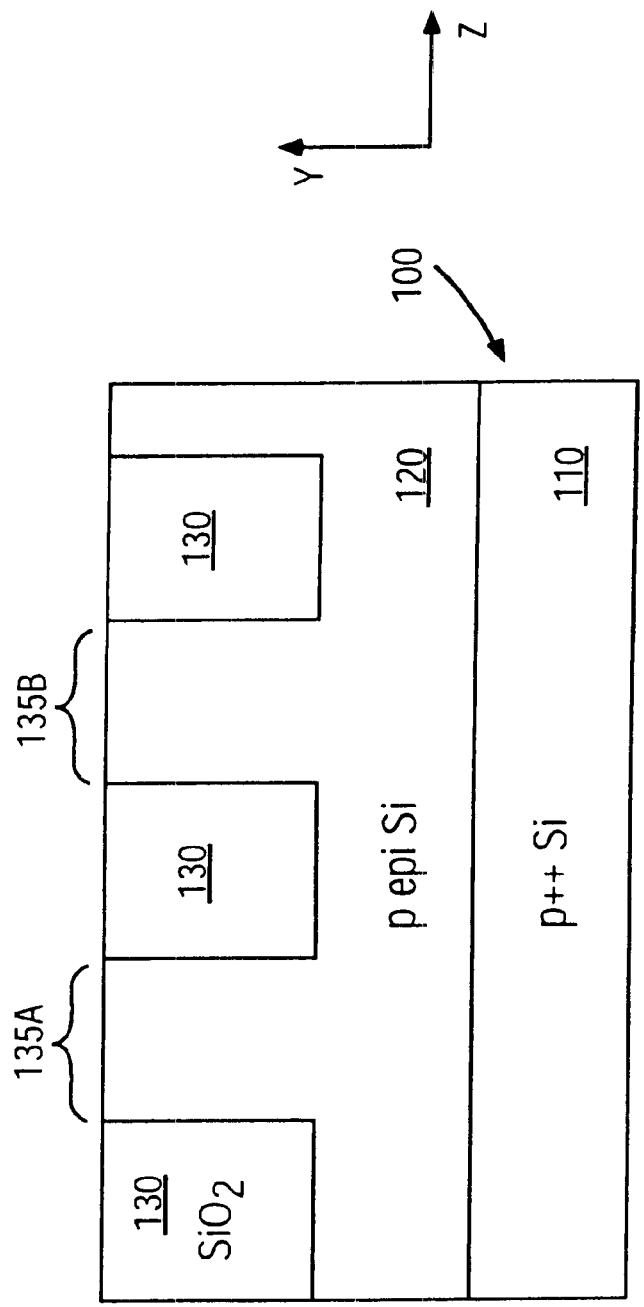
FIG. 2 schematically illustrates a cross-sectional planar side view of a portion of a semiconductor substrate having dielectric trenches formed therein defining a z-direction thickness of a memory cell in accordance with one embodiment of the invention of forming a memory element on a substrate.

FIGS. 2–13 illustrate the fabrication of representative memory element 15 of FIG. 1. FIG. 2 shows a portion of substrate 100 that is, for example, a semiconductor substrate. In this example, a P-type dopant such as boron is introduced in portion 110. In one example, a suitable concentration of P-type dopant is on the order of above $5 \times 10^{19} - 1 \times 10^{20}$ atoms per cubic centimeters (atoms/cm$^3$) rendering portion 110 of substrate 100 representatively P$^{++}$. Overlying portion 110 of substrate 100, in this example, is portion 120 of P-type epitaxial silicon. In one example, the dopant concentration is on the order of about $10^{16} - 10^{17}$ atoms/cm$^3$. The introduction and formation of P-type epitaxial silicon portion 120 and P$^{++}$ silicon portion 110 may follow techniques known to those of skill in the art.

FIG. 2 also shows shallow trench isolation (STI) structures 130 formed in epitaxial portion 120 of substrate 100. As will become apparent in the subsequent discussion, STI structures 130 serve, in one aspect, to define the z-direction thickness of a memory element cell, with at this point only the z-direction thickness of a memory element cell defined. In another aspect, STI structures 130 serve to isolate individual memory elements from one another as well as associated circuit elements (e.g., transistor devices) formed in and on the substrate. STI structures 130 are formed according to techniques known to those skilled in the art.

Figure 3:
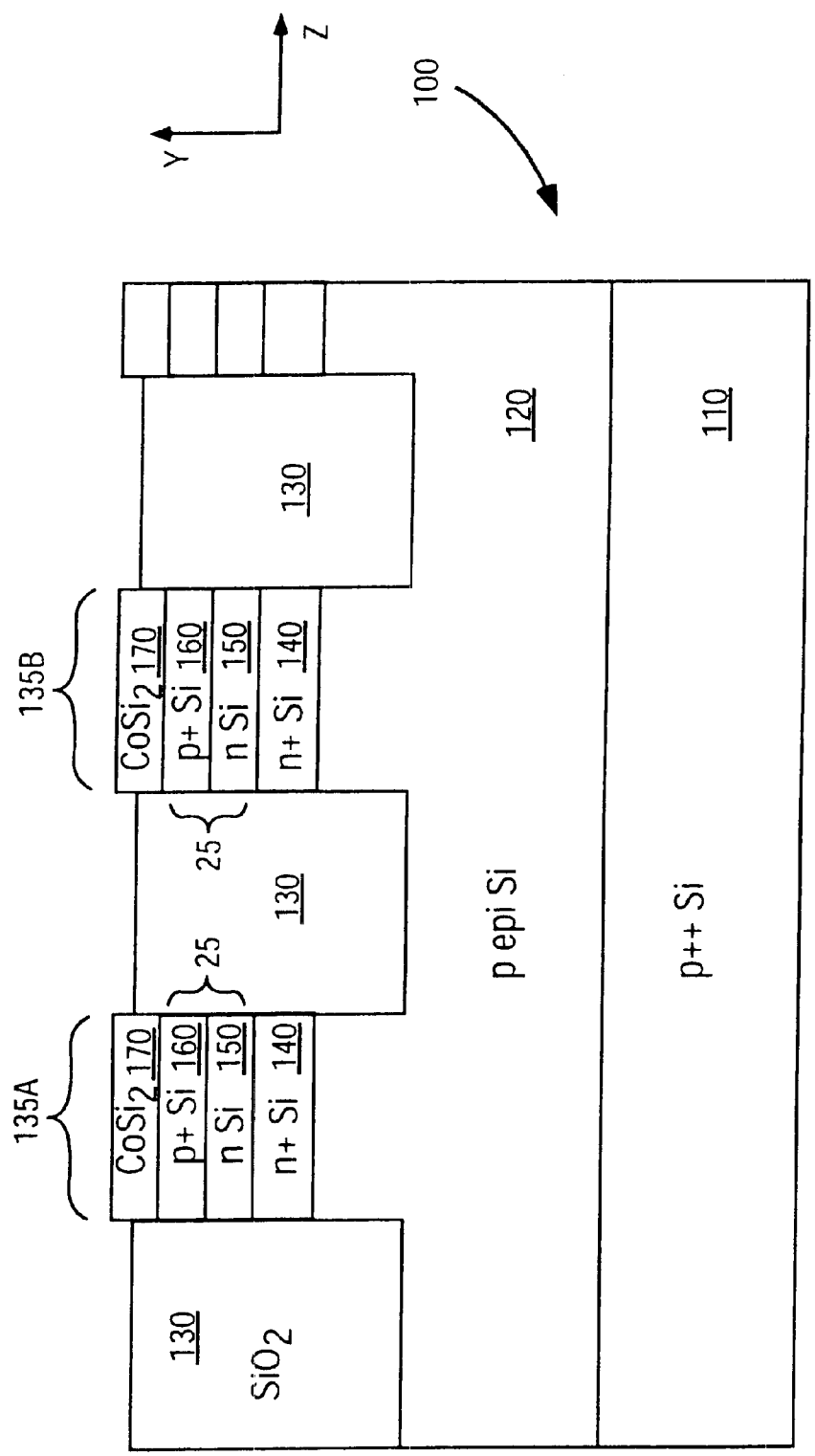
FIG. 3 shows the structure of FIG. 2, through the same cross-sectional view, after the introduction of dopants to form an isolation device for a memory element in accordance with one embodiment of the invention.

FIG. 3 shows the structure of FIG. 2 after a further fabrication operation in memory cell regions 135A and 135B. In one embodiment, memory cell regions 135A and 135B are introduced as strips with the x-direction dimension greater than the z-direction dimension. Overlying epitaxial portion 120 of substrate 100 is first conductor or signal line material 140. In one example, first conductor or signal line material 140 is N-type doped polysilicon formed by the introduction of, for example, phosphorous or arsenic to a concentration on the order of about $10^{18} - 10^{19}$ atoms/cm$^3$ (e.g., N$^+$ silicon). In this example, first conductor or signal line material 140 serves as an address line, a row line (e.g., row line 20 of FIG. 1). Overlying first conductor or signal line material 140 is an isolation device (e.g., isolation device 25 of FIG. 1). In one example, the isolation device is a PN diode formed of N-type silicon portion 150 (dopant concentration on the order of about $10^{17} - 10^{18}$ atoms/cm$^3$) and P-type silicon portion 160 (dopant concentration on the order of about $10^{19} - 10^{20}$ atoms/cm$^3$). Although a PN diode is shown, it is to be appreciated that other isolation structures are similarly suitable. Such devices include, but are not limited to, MOS devices.

Referring to FIG. 3, overlying the isolation device in memory cell regions 135A and 135B is reducer material 170 of, in this example, a refractory metal silicide such as cobalt silicide (CoSi$_2$). Reducer material 170, in one aspect, serves as a low resistance material in the fabrication of peripheral circuitry (e.g., addressing circuitry) of the circuit structure on the chip. Thus, reducer material 170 is not required in terms of forming a memory element as described. Nevertheless, because of its low resistance property, its inclusion as part of the memory cell structure between isolation device 25 and memory element 30 is utilized in this embodiment.

Figure 4:
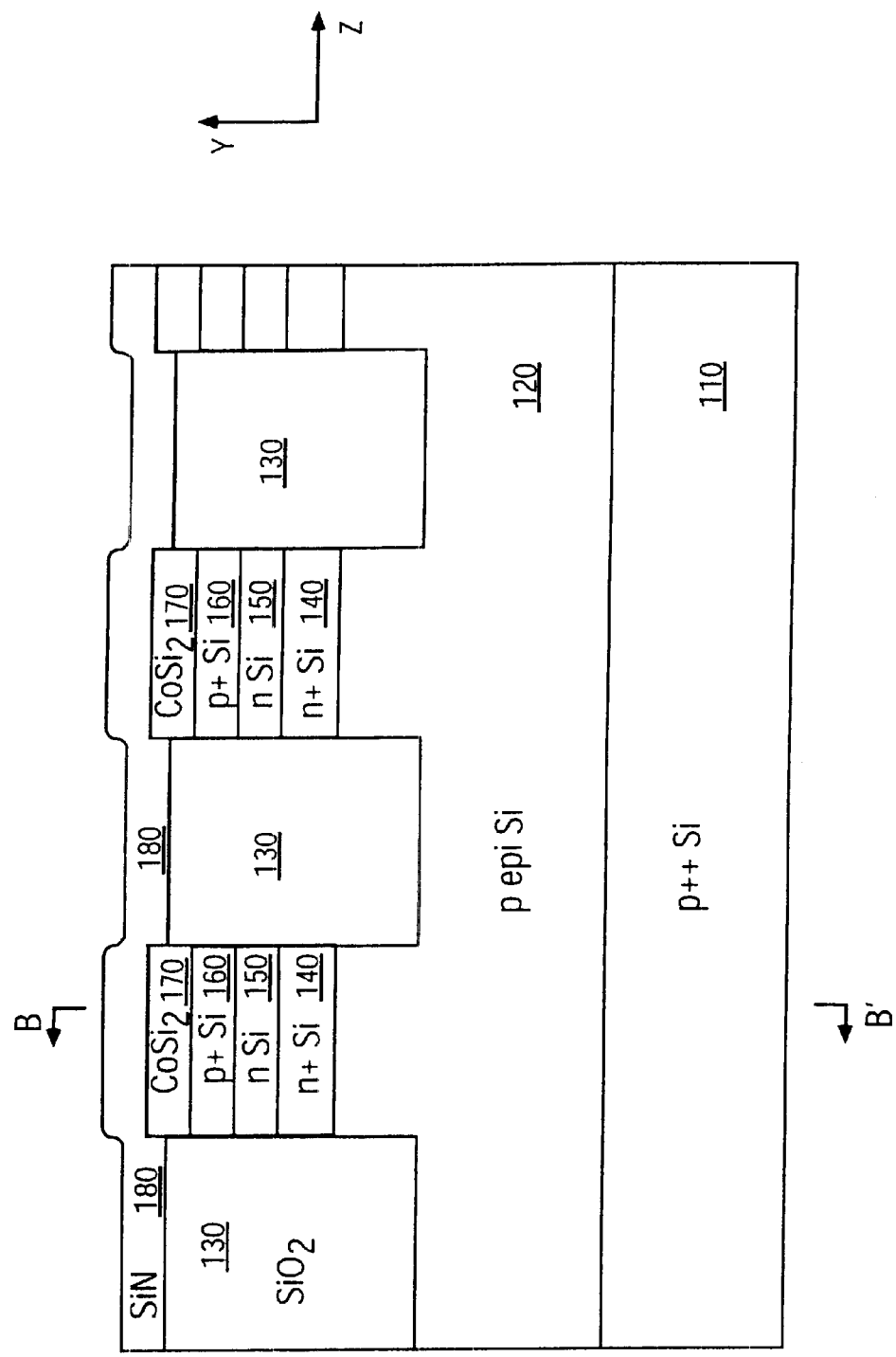
FIG. 4 shows the structure of FIG. 3 after the introduction of a masking material over the structure in accordance with one embodiment of the invention.
Figure 5:
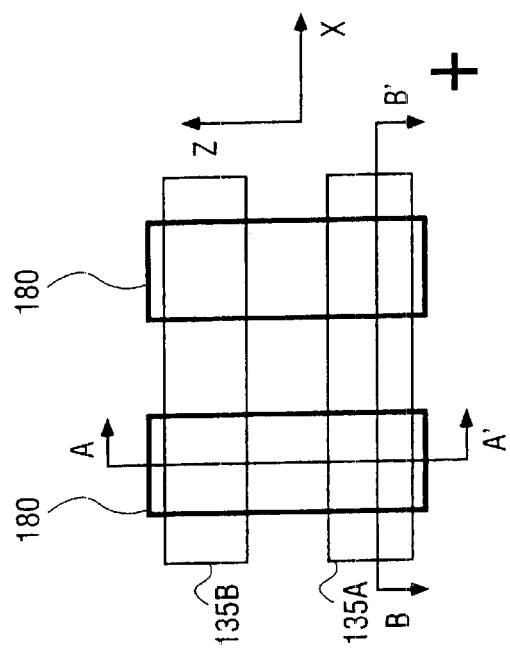
FIG. 5 shows a schematic top view of the structure of FIG. 4.
Figure 6:
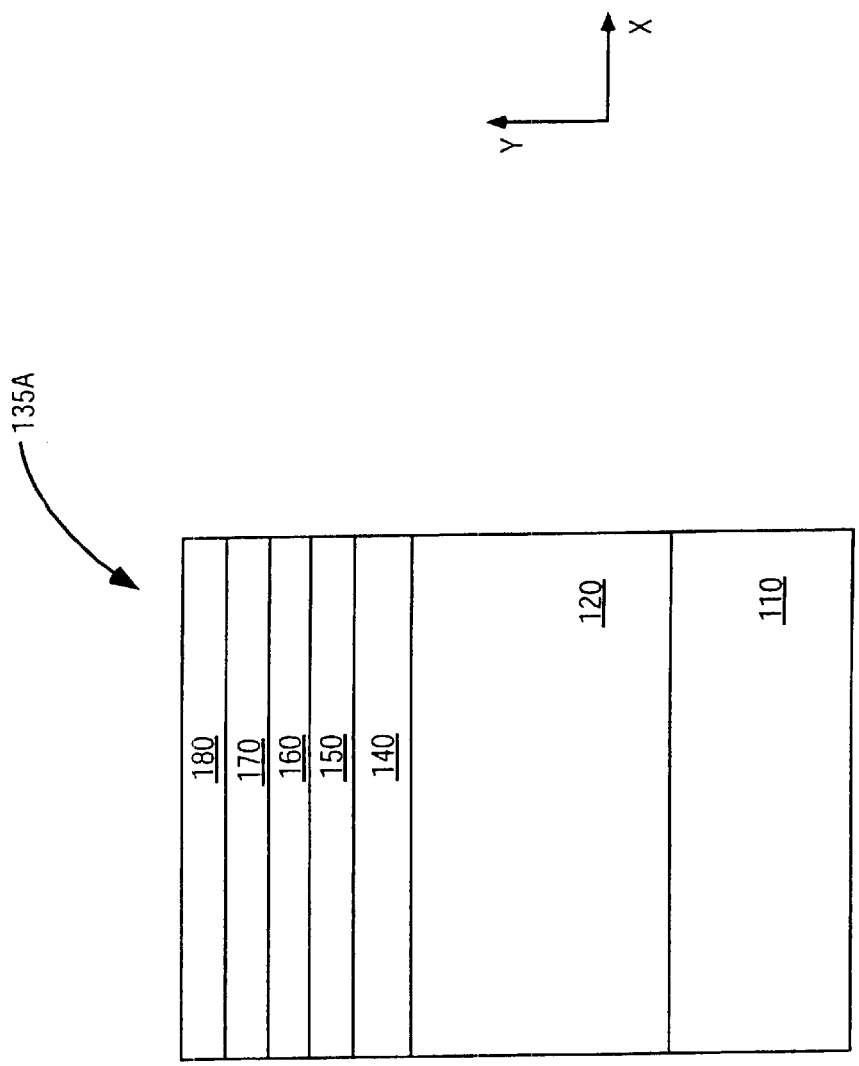
FIG. 6 shows the cross-section of the structure of FIG. 4 through line B–B'.

FIG. 4 shows the structure of FIG. 3 after the introduction of masking material 180. As will become clear later, masking material 180 serves, in one sense, as an etch stop for a subsequent etch operation. FIG. 5 schematically shows memory cell regions 135A and 135B in an xz plane. Overlying the memory cell is masking material 180. FIG. 6 shows a cross-sectional side view of memory cell region 135A through line B–B' of FIG. 5 (i.e., an xy perspective). In one embodiment, a suitable material for masking material 180 is a dielectric material such as silicon nitride ($Si_3N_4$).

Figure 7:
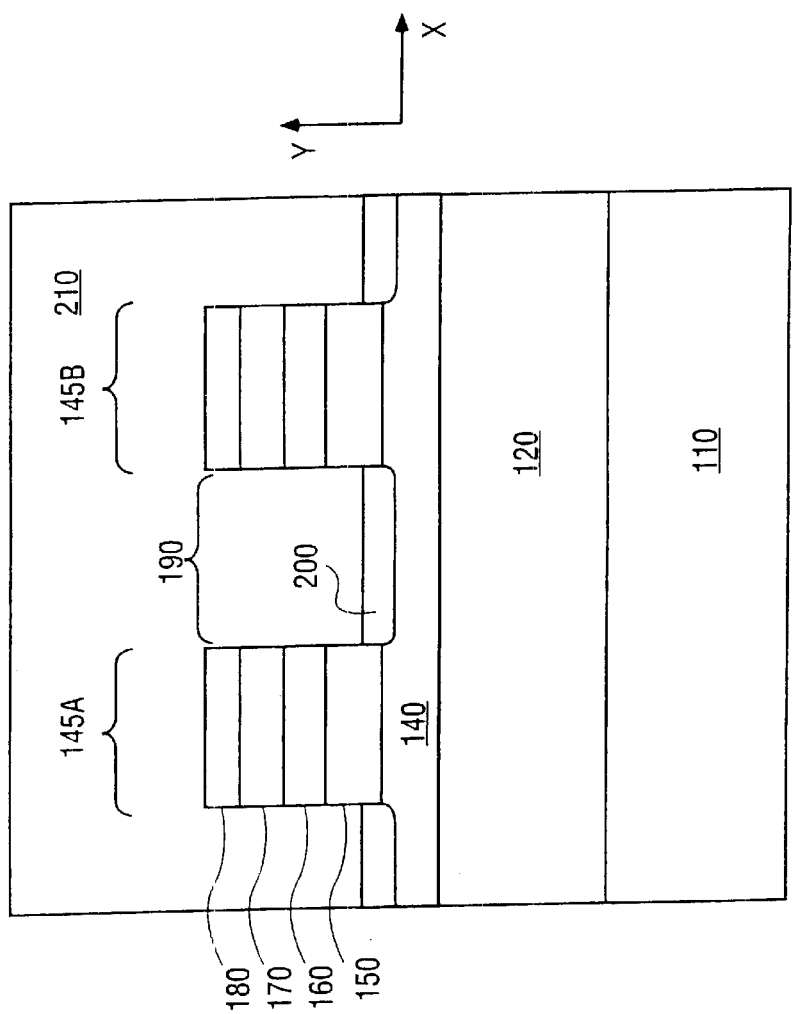
FIG. 7 shows the structure of FIG. 5, through the same cross-sectional view, after the patterning of the x-direction thickness of a memory cell, the introduction of a dopant between the cells, and the introduction of a dielectric material over the structure.

FIG. 7 shows the structure of FIG. 6 (from an xy perspective) after patterning of the x-direction thickness of the memory cell material. FIG. 7 shows two memory cells 145A and 145B patterned from memory cell region 135A (see FIG. 5). The patterning may be accomplished using conventional techniques for etching, in this example, refractory metal silicide and silicon material to the exclusion of masking material 180 (e.g., $Si_3N_4$). The definition of the x-direction thickness involves, in one embodiment, an etch to conductive material 150 of the memory line stack to define memory cells 145A and 145B of memory cell region 135A. In the case of an etch, the etch proceeds through the memory line stack to, in this example, a portion of conductor or signal line material 150. A timed etch may be utilized to stop an etch at this point. Following the patterning, N-type dopant is introduced at the base of each trench 190 to form pockets 200 having a dopant concentration on the order of about $10^{18}$–$10^{20}$ atoms/cm$^3$ (e.g., N$^+$ region) between memory cells 145A and 145B. Pockets 200 serve, in one sense, to maintain continuity of a row line. Dielectric material 210 of, for example, silicon dioxide material is then introduced over the structure to a thickness on the order of 100 Å to 50,000 Å.

Figure 8:
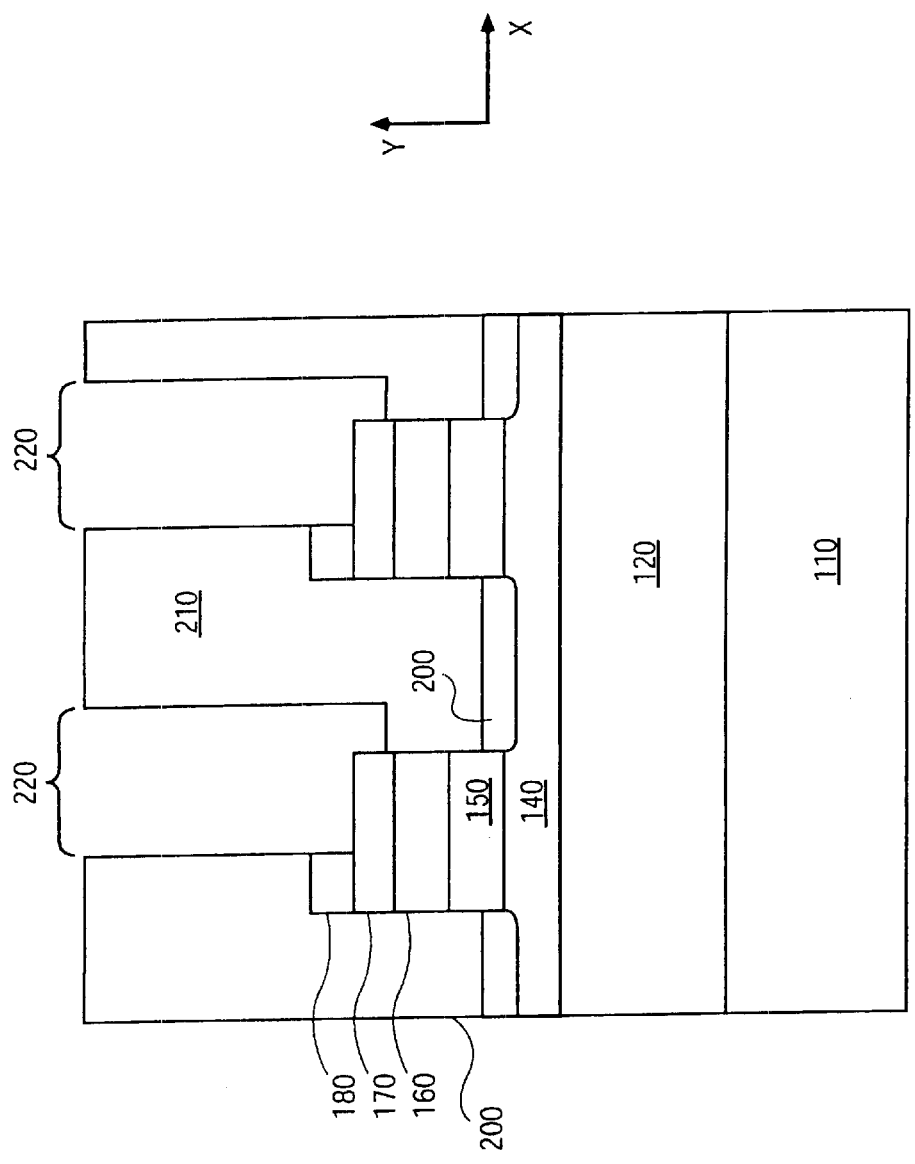
FIG. 8 shows the structure of FIG. 7, through the same cross-sectional view, after the formation of trenches through the dielectric material in accordance with one embodiment of the invention.

FIG. 8 shows the structure of FIG. 7 after the formation of trenches 220 through dielectric materials 210 and 180 to reducer material 170. The formation of trenches 220 may be accomplished using lithographic/etch patterning with an etchant(s) selective for etching dielectric material 210 and masking material 180 and not reducer material 170 (e.g., reducer 170 serving as an etch stop). The smallest size trench that can be etched is a minimum feature size. According to the current technologies, lithographic patterning of trench openings on the order of 0.25 microns are possible with accurate alignment.

Figure 9:
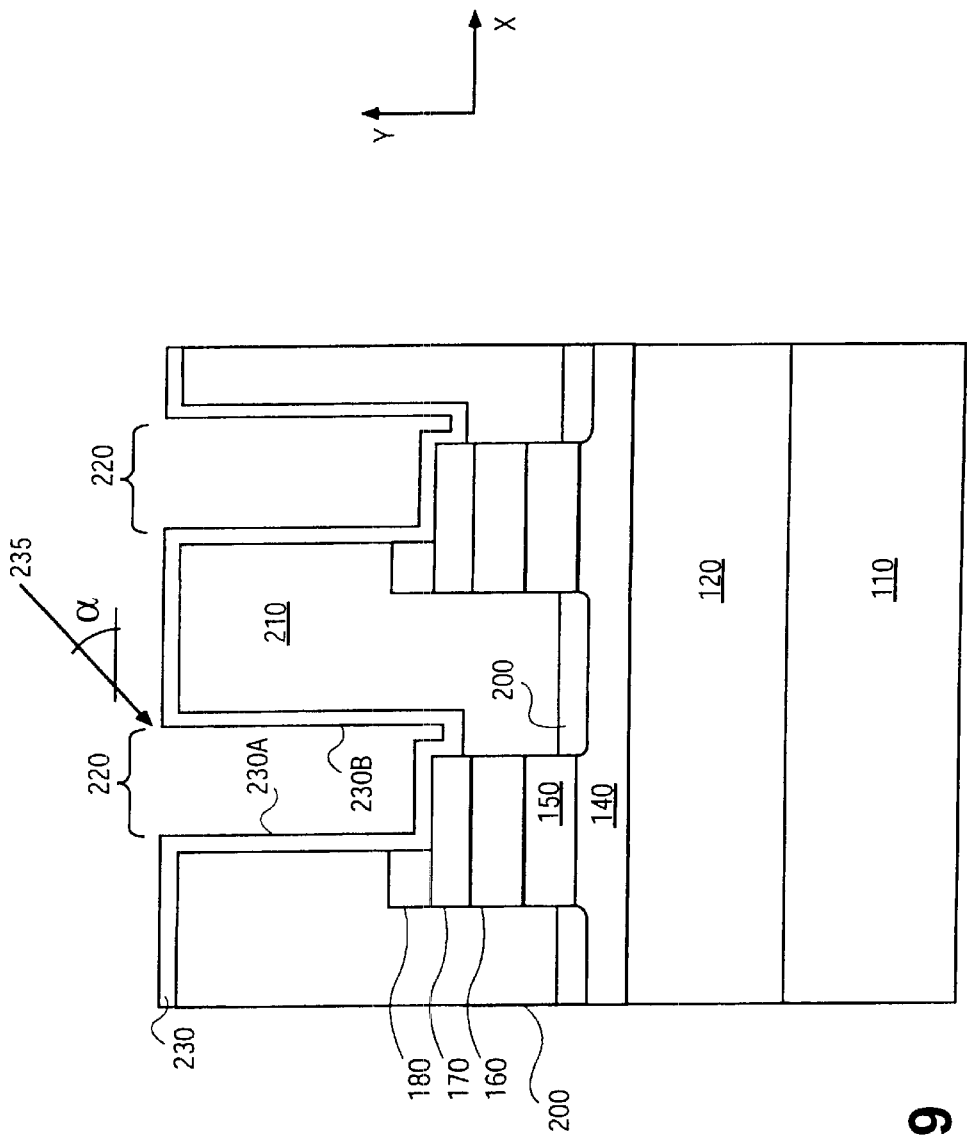
FIG. 9 shows the structure of FIG. 8, through the same cross-sectional view, after the introduction of an electrode material over the structure in accordance with one embodiment of the invention.

FIG. 9 shows the structure of FIG. 8 after the conformal introduction of electrode material 230. In one example, electrode material 230 is semiconductor material such as intrinsic polycrystalline silicon. Other suitable materials include carbon and semi-metals such as transition metals including titanium, titanium-tungsten, titanium silicide ($Ti_xSi_y$), titanium nitride (TiN), and titanium aluminum nitride ($Ti_xAl_yN_z$). The introduction is conformal in the sense that electrode material 230 is introduced as a thin film along the side walls and base of trench 220 such that electrode material 230 is in contact with reducer material 170. Film thicknesses on the order of 50 to 350 angstroms (Å) are suitable according to current technology. The conformal introduction of electrode material 230 that is, for example, polycrystalline silicon may follow conventional introduction techniques known to those skilled in the art including chemical vapor deposition (CVD) techniques.

When electrode material is introduced along the sidewalls of a trench, two possible sidewall conductors are formed, spaced apart by a feature size minus two film thicknesses. As noted above, the size of a memory device is directly related to the size of the electrical contact of the electrode to a subsequently introduced phase change memory material. Thus, it is desirable that a subsequently introduced phase change memory material contact one but not both of the underlying conductors (e.g., electrode sidewall materials). This presents difficulties where the trench width is a minimum feature size, since a misalignment tolerance of about one-third the feature size is typical in locating a subsequently introduced phase change material over the electrode material.

In the example where electrode material 230 is semiconductor material such as intrinsic polycrystalline silicon, intrinsic polycrystalline silicon is effectively an insulator when it is undoped. By doping the intrinsic material and thermally activating the doped material, the material becomes a conductor. Thus, in one embodiment, following the introduction of electrode material 230, a dopant is introduced into the polycrystalline silicon to, in one aspect, lower the resistance of the material. In the example shown, a suitable dopant is a P-typed dopant such as boron introduced to a concentration on the order of about $10^{19}$–$10^{20}$ atoms/cm$^3$. In one embodiment, the dopant is introduced at an angle such that electrode material 230A along a side wall of trench 220 is primarily exposed to the dopant while electrode material 230B is exposed to little or no dopant. In this manner, the resistance of electrode material 230A may be reduced below the resistance of electrode material 230B, i.e., electrode material 230A becomes a conductor while electrode material 230B is effectively an insulator. FIG. 9 shows dopant introduction 235, such as an implantation, at angle, α, of about 15° to 75° and preferably 60° to 75°, from the plane of the substrate to introduce a dopant (e.g., P-typed dopant) into electrode material 230A to the significant exclusion of electrode material 230B. Such an angle implantation may be carried out according to techniques known to those skilled in the art and is chosen so that the entire length of the sidewall receives implantation. The implantation occurs at an angle that is greater than the arctangent of the height of the insulator trench divided by the width of the trench after the electrode material is introduced.

In another embodiment, electrode material 230B is counter-doped. A first dopant introduced along a portion of electrode material 230A (again at an angle) adjacent reducer material 170 is of a first type (e.g., P$^+$-type). A second dopant introduced (also at an angle) over another portion of electrode material 230A is of a second type (e.g., N$^+$-type). In the example of P$^+$-type and N$^+$-type counter-doping, the different portions of electrode material 230A have different levels of charge carriers (e.g., N$^+$-type portion>P$^+$-type portion). The difference in charge carriers generally modifies the resistance of the electrode.

Figure 10:
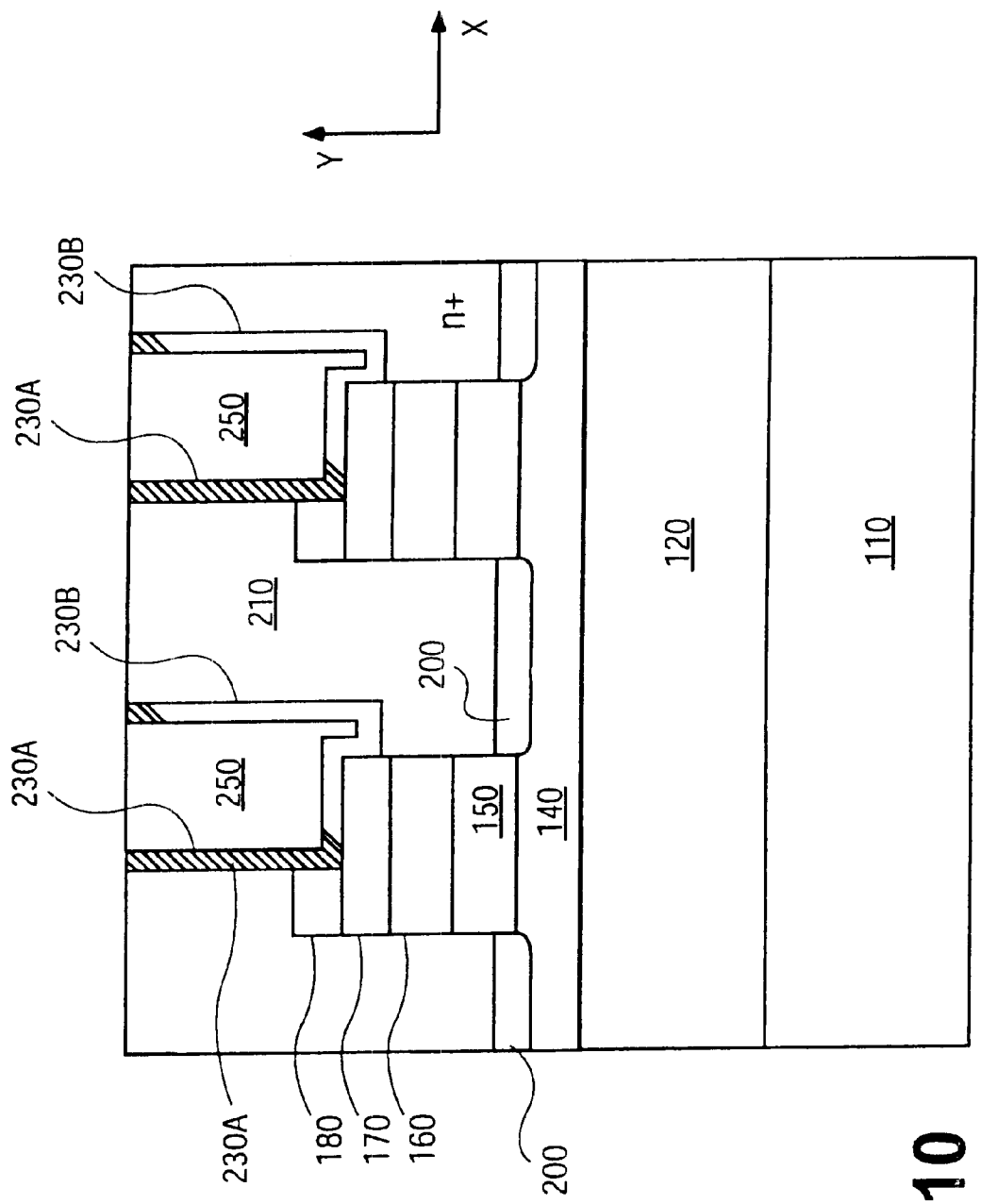
FIG. 10 shows the structure of FIG. 9, through the same cross-sectional view, after the introduction of a dopant into the electrode material in accordance with one embodiment of the invention.

FIG. 10 shows the structure of FIG. 9 after the introduction of a dopant into electrode material 230A. As illustrated, the electrode material 230A is doped (with one dopant or counter-doped) about its length from reducer material 170. Following dopant introduction, the doped semiconductor material may be thermally activated through techniques known to those of skill in the art. FIG. 10 also shows the structure after the introduction of dielectric material 250 into trenches 220 and a planarization step that removes the horizontal component of electrode material 230. Suitable planarization techniques include those known to those of skill in the art, such as chemical or chemical-mechanical polish (CMP) techniques.

Figure 11:
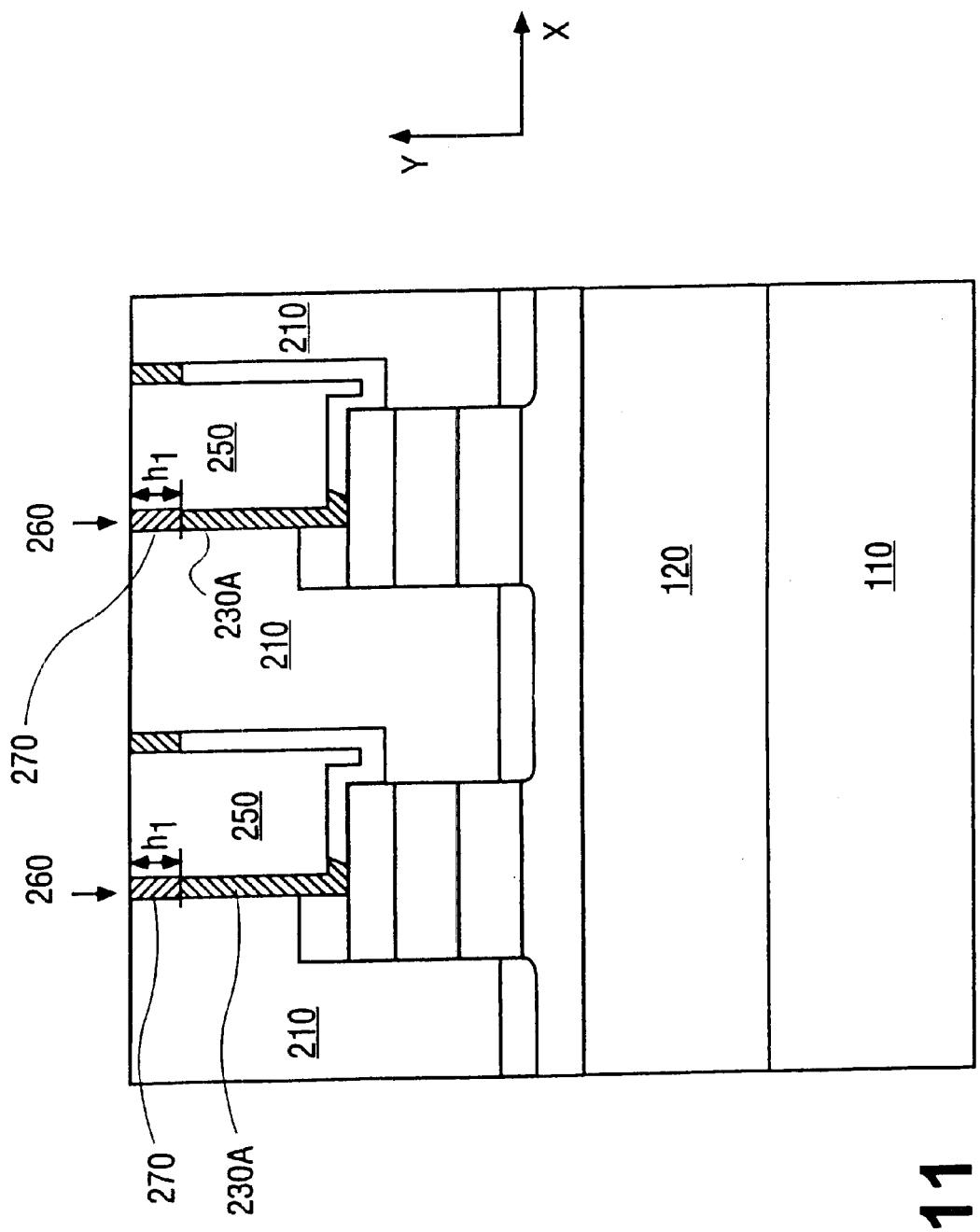
FIG. 11 shows the structure of FIG. 10, through the same cross-sectional view, after the introduction of a modifying material into a portion of the electrode material in accordance with one embodiment of the invention.

FIG. 11 shows the structure of FIG. 10 after the introduction of modifying species 260 into a portion of electrode material 230A. In one example, modifying species 260 is a chemical modifier that combines or reacts with electrode material 230A to form a different material. In the example where electrode material 230A is polycrystalline silicon, modifying species 260 includes a chemical agent that reacts or combines with silicon.

In one embodiment, modifying species 260 is introduced to raise the local resistance of electrode material 230A at a portion of electrode material 270 defined by length, $h_1$. Suitable modifiers include, but are not limited to, carbon that reacts or combines with silicon to produce silicon carbide (SiC), oxygen to form $SiO_2$ or nitrogen to form $Si_3N_4$ or $SiN_xO_y$. Where modifying species 260 is TiN, suitable modifiers include, but are not limited to, oxygen, to form $TiN_xO_y$. Suitable materials also include those materials that are introduced (e.g., added, reacted, or combined) into electrode material 230A and raise the resistivity value within the electrode (e.g., raise the local resistance near a volume of memory material), and the resistivity value is also stable at high temperatures, i.e., a stable thermal coefficient of resistivity (TCR) such that the material experiences little or no variation to a positive temperature change, particularly at temperatures greater than 600° C.

Referring to FIG. 11, modifying species 260 is introduced into electrode material 230A to form electrode material 270. FIG. 11 shows the structure having an electrode of two different material portions: electrode material 230A (e.g., doped polycrystalline silicon) and electrode material 270 (e.g., polycrystalline silicon and SiC, $SiO_2$, etc.). Electrode material 270 is introduced into a portion of the electrode adjacent the exposed surface of the electrode. In one example, electrode material 270 has a resistivity, $R_1$, that is higher than a resistivity, $R_2$, of electrode material 230A at temperatures greater than 600° C. (e.g., 650° C.) or at least has a thermal coefficient of resistivity that has a lower variation to positive temperature change.

The amount/depth of the electrode material 270 generally depends on the amount of voltage that will be used to set or reset a volume of memory material. Using voltages in the range of about 3.3 volts (V) according to current technology, a suitable depth for modifying material 270 of, for example, SiC or $SiO_2$, into a polycrystalline silicon electrode is approximately 600 angstroms (Å). At lower voltages, a shorter depth would be suitable.

As described above, modifying material 270 will be substantially adjacent to a volume of memory material. Because, in the embodiment described, modifying material 270 is of a higher resistivity, the material may not provide sufficiently suitable ohmic contact between the electrode and the volume memory material for a desired application. In such cases, modifying material may be introduced into the electrode at a depth below the exposed surface of the electrode. In the example described, an electrode of polycrystalline silicon may have polycrystalline silicon at the exposed surface (referring to FIG. 11) and modifying material 270 at a depth below the exposed surface but not adjacent the exposed surface (e.g., 200–1000 Å below the exposed surface). Suitable implantation energies may be formulated to establish the depth of electrode material 270. In one example, a second introduction (e.g., deposition and doping) may also be employed to follow the introduction of modifying species 260 (to form electrode material 270) and locate polycrystalline silicon adjacent the exposed surface of the electrode.

Figure 12:
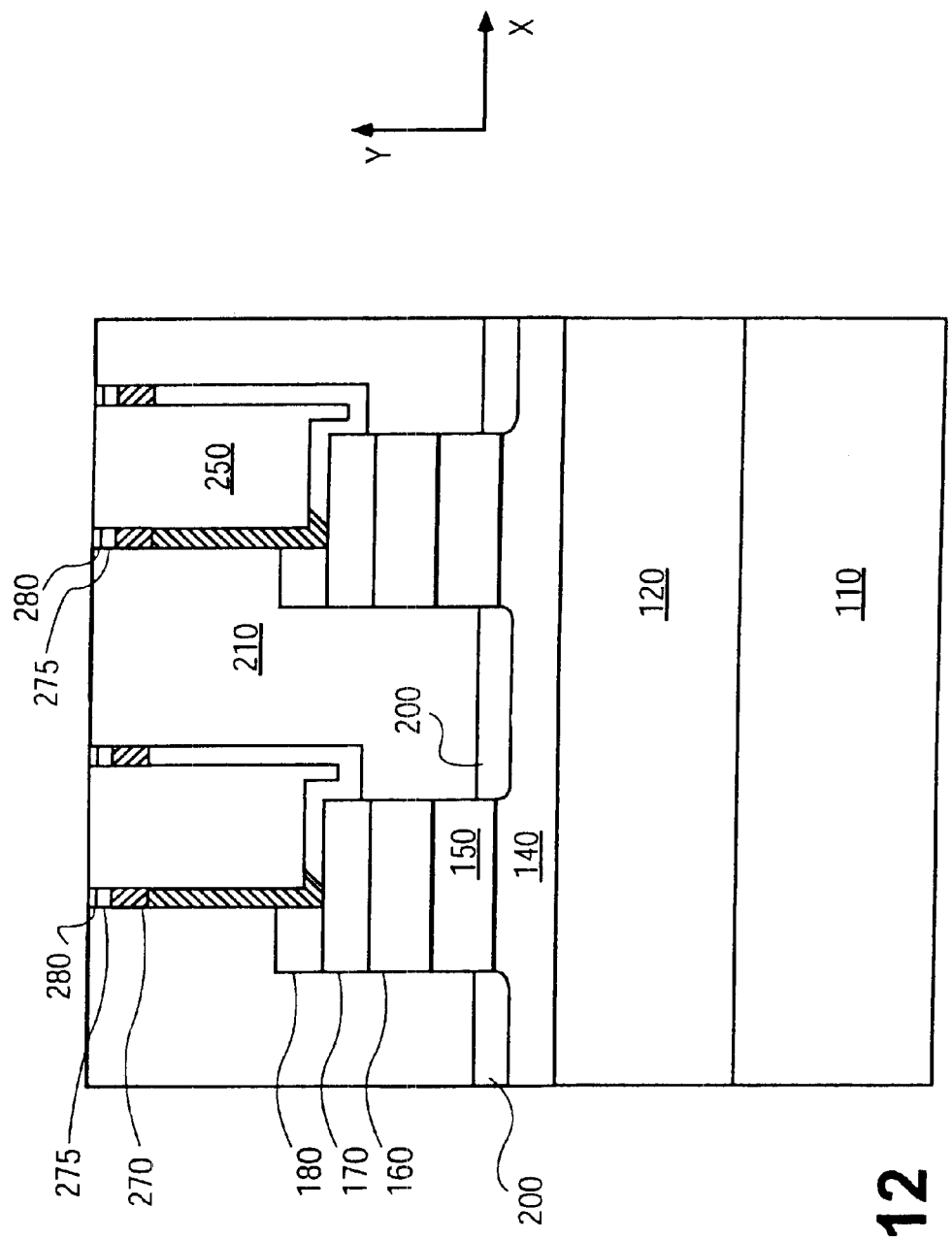
FIG. 12 shows the structure of FIG. 11, through the same cross-sectional view, after the introduction of barrier material over the electrode in accordance with one embodiment of the invention.

FIG. 12 shows the structure of FIG. 11 after the optional introduction of barrier materials 275 and 280. Barrier material 275 is, for example, titanium silicide ($TiSi_2$) introduced to a thickness on the order of about 100–300 Å. Barrier material 280 is, for example, titanium nitride (TiN) similarly introduced to a thickness on the order of about 25–300 Å. The introduction of barrier materials 275 and 280 may be accomplished using techniques known to those skilled in the art.

Figure 13:
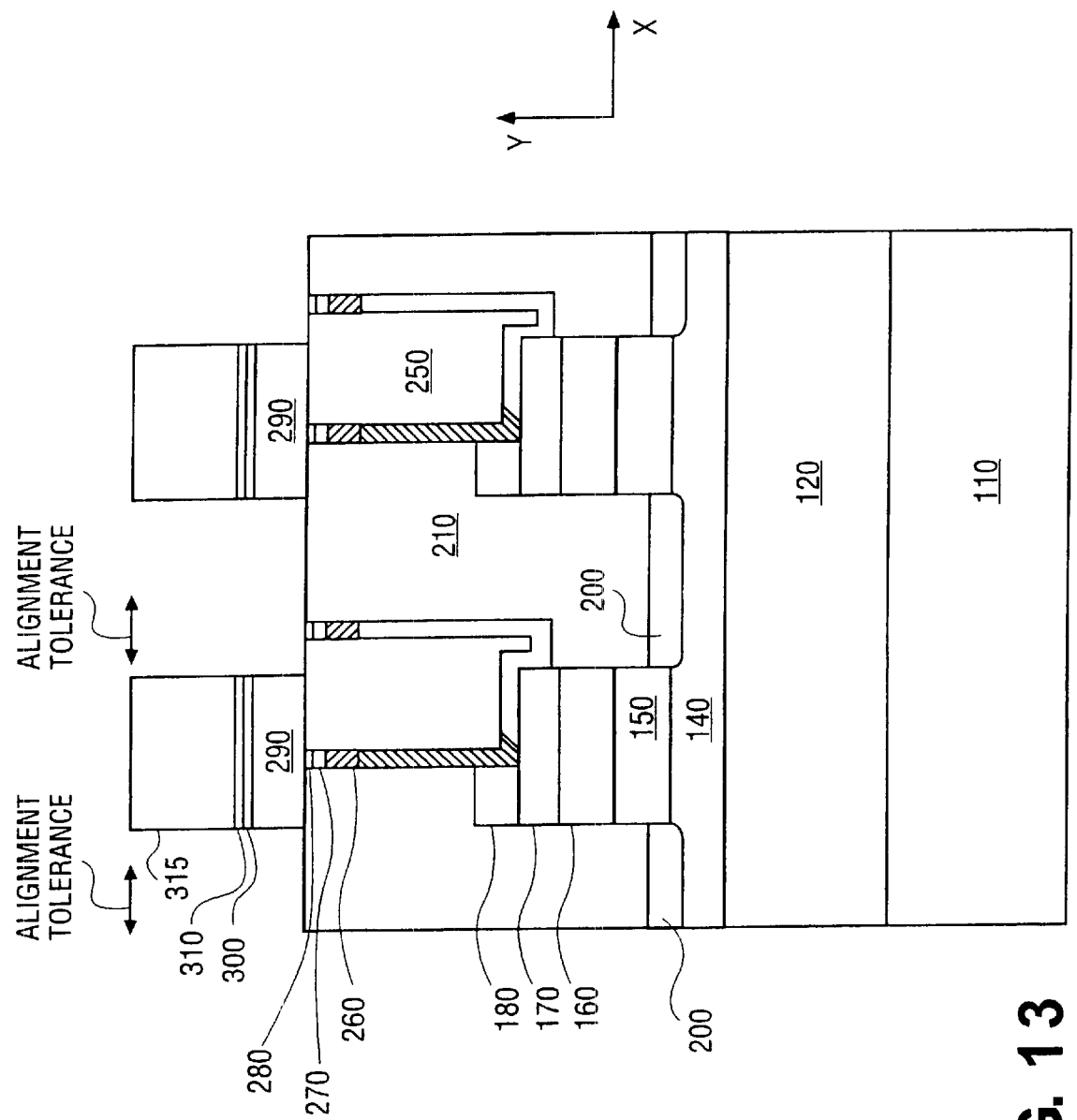
FIG. 13 shows the structure of FIG. 12, through the same cross-sectional view, after the introduction of a volume of memory material and second conductors over the structure according to a first alignment, in accordance with one embodiment of the invention.

FIG. 13 shows the structure of FIG. 12 after the introduction of a volume of memory material 290 (represented as memory element 30 in FIG. 1). In one example, memory material 290 is a phase change material. In a more specific example, memory material 290 includes a chalcogenide element(s). Examples of phase change memory material 290 include, but are not limited to, compositions of the class of tellerium-germanium-antimony ($Te_xGe_ySb_z$) material. The volume of memory material 290, in one example according to current technology, is introduced and patterned with a thickness on the order of about 300 to 600 Å and on the order of about one feature size wide (e.g., about 25 microns according to current technology).

Figure 14:
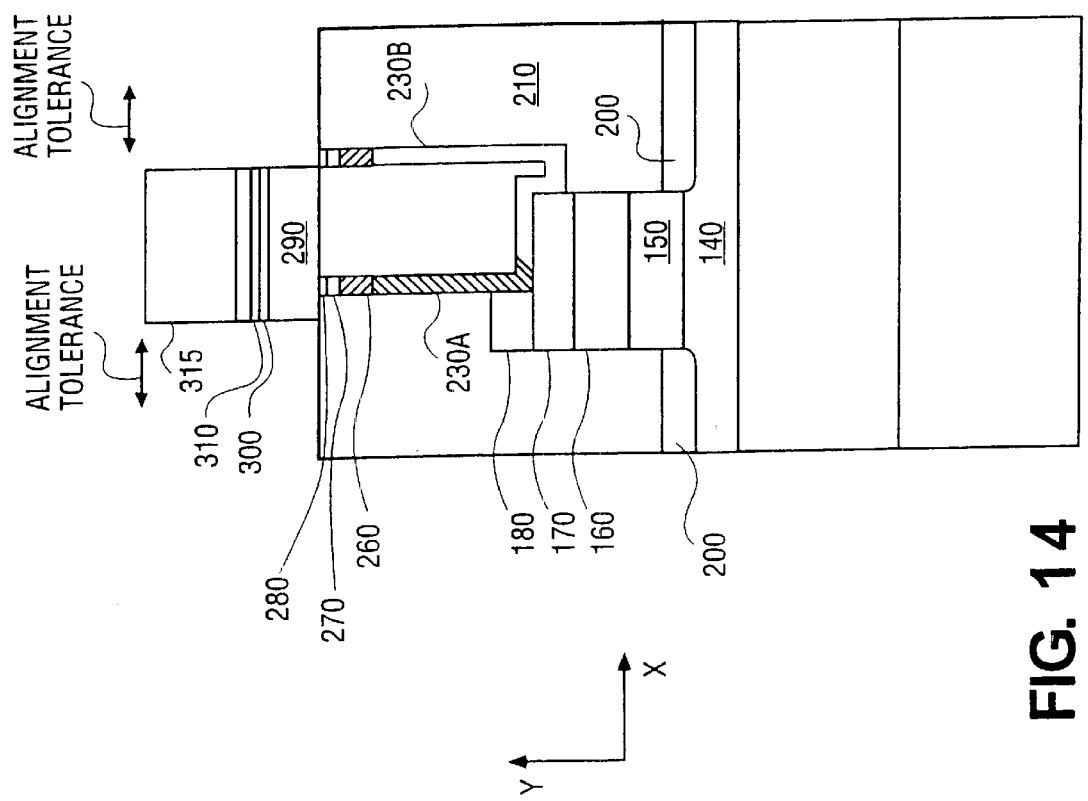
FIG. 14 shows the structure of FIG. 12, through the same cross-sectional view, after the introduction of a volume of memory material and second conductors over the structure according to a second alignment, in accordance with one embodiment of the invention.

FIG. 13 and FIG. 14 illustrate the alignment tolerance associated with introducing phase change memory material 290 over electrode material 230A. In FIG. 13, memory material 290 is located directly over electrode material 230A and any conduction through electrode material 230B should not be seen at memory material 290. Misalignment tolerances are typically one-third the feature size. Thus, according to current technology, memory material 290 of a minimum feature size can be positioned to cover electrode material 230A but it may also overlap electrode material 230B, as illustrated in FIG. 14. Rather than increase the width of the trench, one aspect of the invention contemplates that only electrode material 230A be a conductor. In the case of electrode material of polycrystalline silicon, this may be accomplished by exclusively doping and thermally activating electrode material 230A.

Overlying the volume of memory material 290 in the structure of FIG. 13 are barrier materials 300 and 310 of, for example, titanium (Ti) and titanium nitride (TiN), respectively. Barrier material serves, in one aspect, to inhibit diffusion between the volume of memory material 290 and second conductor or signal line material overlying the volume of memory material 290 (e.g., second electrode 10). Overlying barrier materials 300 and 310 is second conductor or signal line material 315. In this example, second conductor or signal line material 315 serves as an address line, a column line (e.g., column line 10 of FIG. 1). Second conductor or signal line material 315 is patterned to be, in one embodiment, generally orthogonal to first conductor or signal line material 140 (column lines are orthogonal to row lines). Second conductor or signal line material 315 is, for example, an aluminum material, such as an aluminum alloy. Methods for the introduction and patterning of the barrier materials and second conductor or signal line material 315 include such techniques as known to those of skill in the art.

Referring to FIG. 13, memory material 290 and second conductor or signal line material 315 may be patterned with similar x-direction and z-direction dimensions. Thus, memory material 290 and second conductor or signal line material 315 are contiguous strips. Such a configuration may be achieved by patterning memory material 290 after the introduction of barrier materials 300 and 310 and second conductor or signal line material 315, e.g., with a similar pattern mask used to pattern each of the materials. Alternatively, memory material 290 may be separately patterned into strips or islands by, for example, patterning following its introduction.

In one embodiment, a volume of memory material 290 is programmable by the order of phase of the volume of memory material. Joule heating may be used, for example, to amorphosize or crystallize a volume of memory material 290 by raising such material to its melting point or to a point between its glass transition temperature and its melting point, respectively. The memory material is chosen, in one example, so that it is generally an insulator in an amorphous phase and generally conductive in a crystalline phase. Where memory material 290 is a strip contiguous with, for example, a column line of second conductor or signal line material 315, a representative strip is, for example, 200 microns in length with several electrodes coupled to the strip representing discrete memory devices. Typically, phase change memory material 290 that is a strip is predominantly in a conductive semi-metallic state with only a small portion of the material immediately surrounding the electrode area of contact undergoing a phase transition. The volume of this phase change region generally depends on the size of the contact and may be estimated at 100 to 200 angstroms larger than the electrode. In one embodiment, it is only necessary to insure that the material in direct contact with the electrode changes phase in order to disconnect the conductive, phase change memory material/column line from the electrode.

Figure 15:
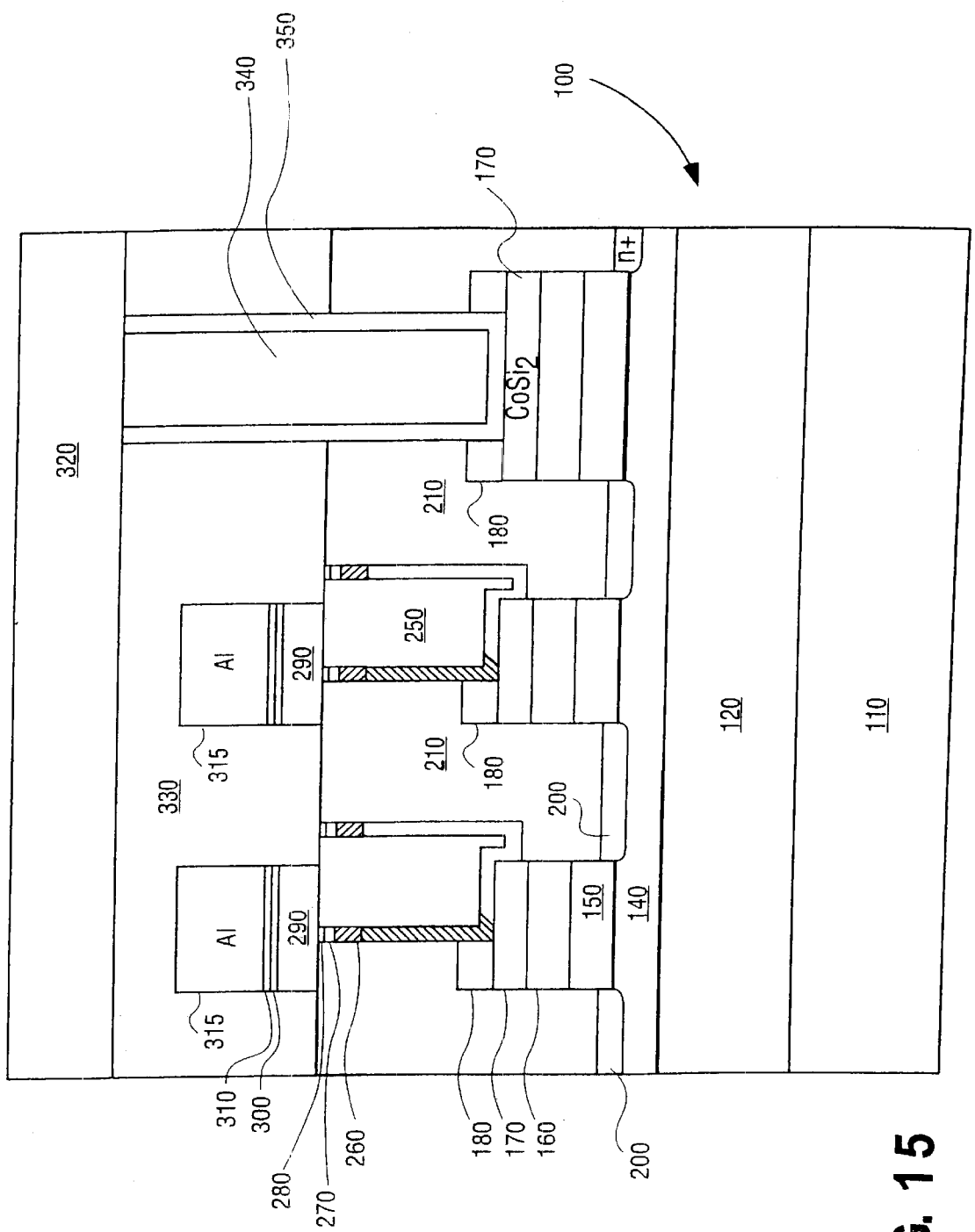
FIG. 15 shows the structure of FIG. 13, through the same cross-sectional view, after the introduction of the dielectric material over the second conductor and a third conductor coupled to the first conductor in accordance with an embodiment of the invention.

FIG. 15 shows the structure of FIG. 13 after the introduction of dielectric material 330 over second conductor or signal line material 315. Dielectric material 330 is, for example, $SiO_2$ or other suitable material that surrounds second conductor or signal line material 315 and memory material 290 to electronically isolate such structure. Following introduction, dielectric material 330 is planarized and a via is formed in a portion of the structure through dielectric material 330, dielectric material 210, and masking material 180 to reducer material 170. The via is filled with conductive material 340 such as tungsten (W) and barrier material 350 such as a combination of titanium (Ti) and titanium nitride (TiN). Techniques for introducing dielectric material 330, forming and filling conductive vias, and planarizing are known to those skilled in the art.

The structure shown in FIG. 14 also shows additional conductor or signal line material 320 introduced and patterned to mirror that of first conductor or signal line material 140 (e.g., row line) formed on substrate 100. Mirror conductor line material 320 mirrors first conductor or signal line material 140 and is coupled to first conductor or signal line material 140 through a conductive via. By mirroring a doped semiconductor such as N-type silicon, mirror conductor line material 320 serves, in one aspect, to reduce the resistance of conductor or signal line material 140 in a memory array, such as memory array 5 illustrated in FIG. 1. A suitable material for mirror conductor line material 320 includes an aluminum material, such as an aluminum alloy.

In the above description of forming a memory element such as memory element 15 in FIG. 1, an electrode is described between a memory material and a conductor or signal line (e.g., row lines and column lines) that is formed of a minimum size so that the size of the memory device and the power required to program the memory device are reduced. By limiting conduction through the electrode material along one sidewall, alignment tolerances, particularly in locating phase change material are accommodated. The discussion detailed the formation of one memory element of memory array 5. Other memory elements of memory array 5 may be fabricated in the same manner. It is to be appreciated that many, and possibly all, memory elements of memory array 5, along with other integrated circuit circuitry, may be fabricated simultaneously. In this regard, by controlling the conductive path between phase change memory material and a conductor, performance variations brought about by alignment tolerance issues are reduced and consistent performance between similar devices is improved In the above description, an electrode material selectively doped and activated of polycrystalline silicon was described. It is to be appreciated that other methods of modifying electrode material may be employed so that only a material along one sidewall of the trench-patterned electrode material acts as a conductive path between first conductor or signal line 140 (e.g., contact) and the phase change material. Such techniques may depend on the material chosen for the electrode material and include in the case of a generally conductive electrode material (e.g., electrode material 230), the introduction of an insulative species into electrode material 230B or the selective etching (e.g., angled etching) of a portion of electrode material 230B.

Figure 16:
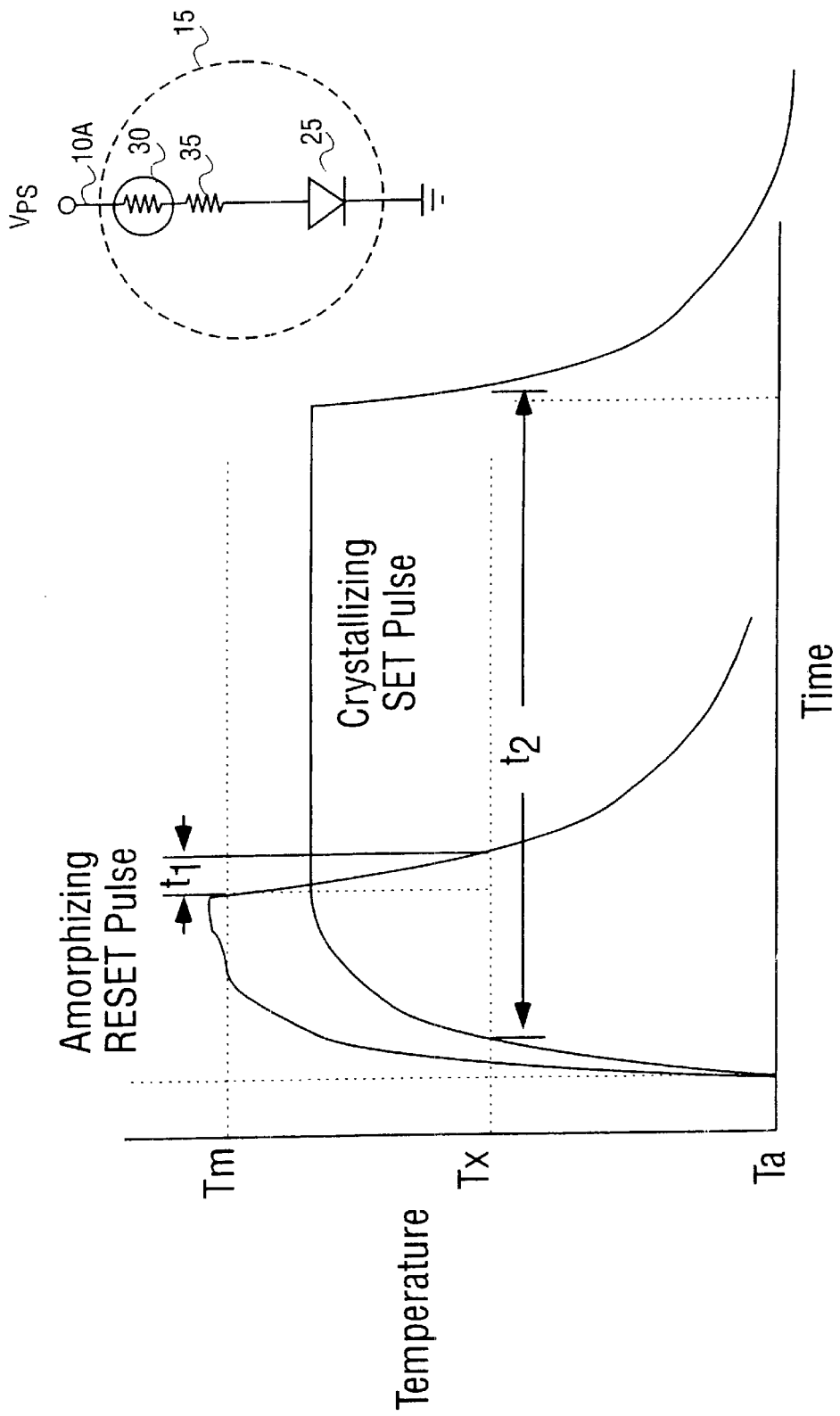
FIG. 16 shows a graphical representation of setting and resetting a volume of a phase change memory material in terms of temperature and time.

FIG. 16 presents a graphical representation of the programming (e.g., setting and resetting) of a volume of phase change memory material. Referring to FIG. 1, programming memory element 15 (addressed by column line 10a and row line 20a) involves, in one example, supplying a voltage to column line 10a to introduce a current into the volume of memory material 30. The current causes a temperature increase at the volume of memory material 30. Referring to FIG. 16, to amorphize a volume of memory material, the volume of memory material is heated to a temperature beyond the amorphizing temperature, $T_M$ (e.g., beyond the melting point of the memory material). A representative amorphizing temperature for a $Te_xGe_ySb_2$ material is on the order of about 600° C. to 650° C. Once a temperature beyond $T_M$ is reached, the volume of memory material is quenched or cooled rapidly (by removing the current flow). The quenching is accomplished at a rate, $t_1$, that is faster than the rate at which the volume of memory material 30 can crystallize so that the volume of memory material 30 retains its amorphous state. To crystallize a volume of memory material 30, the temperature is raised by current flow to the crystallization temperature for the material (e.g., a temperature between the glass transition temperature and the melting point temperature) and retained at that temperature for a sufficient time to crystallize the material. After such time, the volume of memory material is quenched (by removing the current flow).

In the preceding example, the volume of memory material 30 was heated to a high temperature to amorphisize the material and reset the memory element (e.g., program 0). Heating the volume of memory material to a lower crystallization temperature crystallizes the material and sets the memory element (e.g., program 1). It is to be appreciated that the association of reset and set with amorphous and crystalline material, respectively, is a convention and that at least an opposite convention may be adopted. It is also to be appreciated from this example that the volume of memory material 30 need not be partially set or reset by varying the current flow and duration through the volume of memory material.

In the foregoing specification, the invention has been described with reference to specific exemplary embodiments thereof. It will, however, be evident that various modifications and changes may be made thereto without departing from the broader spirit and scope of the invention. The specification and drawings are, accordingly, to be regarded in an illustrative rather than a restrictive sense.

What is claimed is:

1. An apparatus comprising:
   a chalcogenide memory element;
   a contact; and a heater element comprising two leg portions, a first leg portion coupled to the contact and the chalcogenide memory element, and only the first leg portion acts as a conductive path between the contact and the chalcogenide memory element.

2. The apparatus of claim 1, wherein the heater element comprises polycrystalline silicon and the first leg portion comprises a dopant species.

3. The apparatus of claim 1, wherein a second leg portion comprises material having an insulative property.

4. An apparatus comprising:

a dedicated memory chip including a plurality of first address lines and a plurality of second address lines, a plurality of programmable elements electrically coupled to respective ones of the plurality of first address lines and the plurality of second address lines, addressing circuitry coupled to the plurality of first address lines and the plurality of second address lines wherein the programmable element comprises:

a chalcogenide memory element;

a contact; and a heater element comprising two separate leg portions, wherein one of the two leg portions is coupled to the contact and the chalcogenide memory element, and only the one of the two leg portions acts as a conductive path between the contact and the chalcogenide memory element.

5. The apparatus of claim 4, wherein the heater element comprises polycrystalline silicon and the one of the two leg portions comprises a dopant species.

6. The apparatus of claim 5, wherein a second of the two leg portions comprises material having an insulative property.

* * * * *